US008741066B2

(12) United States Patent
Kashkoush et al.

(10) Patent No.: US 8,741,066 B2
(45) Date of Patent: Jun. 3, 2014

(54) METHOD FOR CLEANING SUBSTRATES UTILIZING SURFACE PASSIVATION AND/OR OXIDE LAYER GROWTH TO PROTECT FROM PITTING

(75) Inventors: Ismail Kashkoush, Orefield, PA (US); Thomas Nolan, Grenoble (FR); Dennis Nemeth, Nazareth, PA (US); Richard Novak, Plymouth, MN (US)

(73) Assignee: Akrion Systems, LLC

( * ) Notice: Subject to any disclaimer, the term of this patent is extended or adjusted under 35 U.S.C. 154(b) by 430 days.

(21) Appl. No.: 12/070,620

(22) Filed: Feb. 19, 2008

(65) Prior Publication Data

US 2011/0306210 A1      Dec. 15, 2011

Related U.S. Application Data

(60) Provisional application No. 60/890,375, filed on Feb. 16, 2007.

(51) Int. Cl.
  *B08B 3/12* (2006.01)
  *B08B 3/08* (2006.01)

(52) U.S. Cl.
  USPC ......... 134/1.3; 134/2; 134/3; 134/26; 134/28; 134/29

(58) Field of Classification Search
  CPC ............. H01L 21/0205; H01L 21/02041; H01L 21/02008; H01L 21/00019
  USPC ................. 134/1.3, 2, 3, 26, 28, 29
  See application file for complete search history.

(56) References Cited

U.S. PATENT DOCUMENTS

| 5,238,500 | A  | * | 8/1993 | Bergman ........................... 134/3 |
| 5,516,730 | A  | * | 5/1996 | Pirooz et al. .................. 438/473 |
| 5,919,311 | A  | * | 7/1999 | Shive et al. ....................... 134/1 |
| 6,230,720 | B1 | * | 5/2001 | Yalamanchili et al. ........ 134/1.3 |
| 6,497,768 | B2 |   | 12/2002 | Bergman |
| 6,837,252 | B2 |   | 1/2005 | Bergman |
| 7,404,863 | B2 |   | 7/2008 | Bergman |
| 7,993,452 | B2 |   | 8/2011 | Hayashida et al. |
| 2001/0004898 | A1 |   | 6/2001 | Kamikawa et al. |
| 2003/0019507 | A1 | * | 1/2003 | Kashkoush et al. .............. 134/3 |
| 2004/0103919 | A1 |   | 6/2004 | Kenny et al. |
| 2005/0130420 | A1 |   | 6/2005 | Huang et al. |
| 2005/0178401 | A1 |   | 8/2005 | Boyers |

FOREIGN PATENT DOCUMENTS

JP        2004356416        12/2004

* cited by examiner

*Primary Examiner* — Saeed T Chaudhry
(74) *Attorney, Agent, or Firm* — The Belles Group, P.C.

(57) ABSTRACT

A process/method for cleaning wafers that eliminates and/or reduces pitting caused by standard clean 1 by performing a pre-etch and then passivating the wafer surface prior to the application of the standard clean 1. The process/method may be especially useful for advanced front end of line post-CPM cleaning. In one embodiment, the invention is a method of processing a substrate comprising: a) providing at least one substrate; b) etching a surface of the substrate by applying an etching solution; c) passivating the etched surface of the substrate by applying ozone; and d) cleaning the passivated surface of the substrate by applying an aqueous solution comprising ammonium hydroxide and hydrogen peroxide.

11 Claims, 9 Drawing Sheets

Illustration of Final Counts On Wafers Cleaned Using Inventive AFEOL Cleaning Sequence (0.12 μm) Using Passivation (KLA_Tencor SP1$^{TBI}$ Laser Scanner)

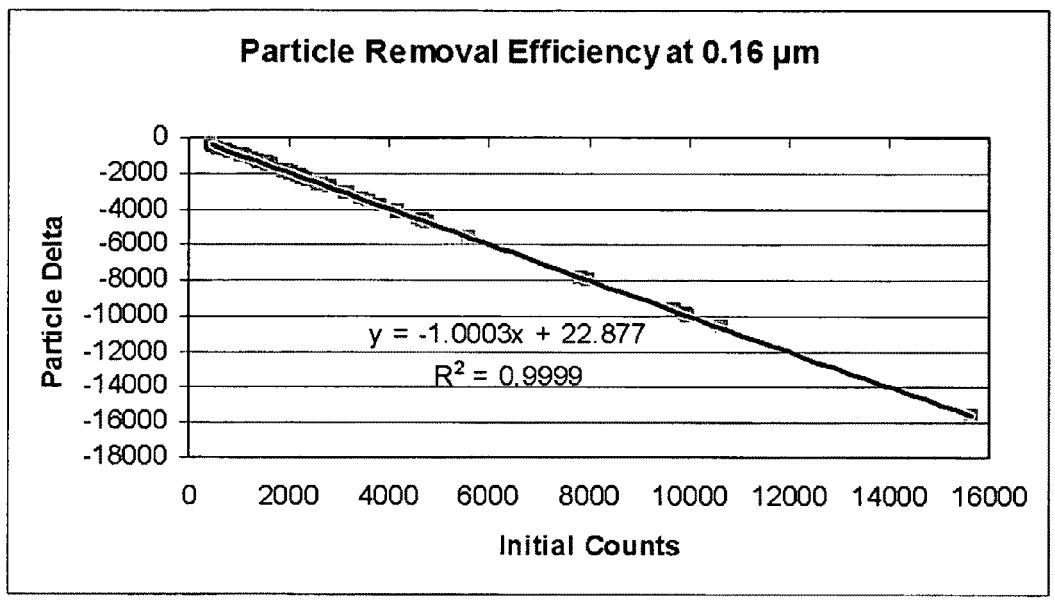
Figure 2: Graph Illustrating Particle Removal Efficiency for Highly Contaminated Wafers (<16000 particles at 0.16 μm) Subjected to Prior Art AFEOL Cleaning Sequence

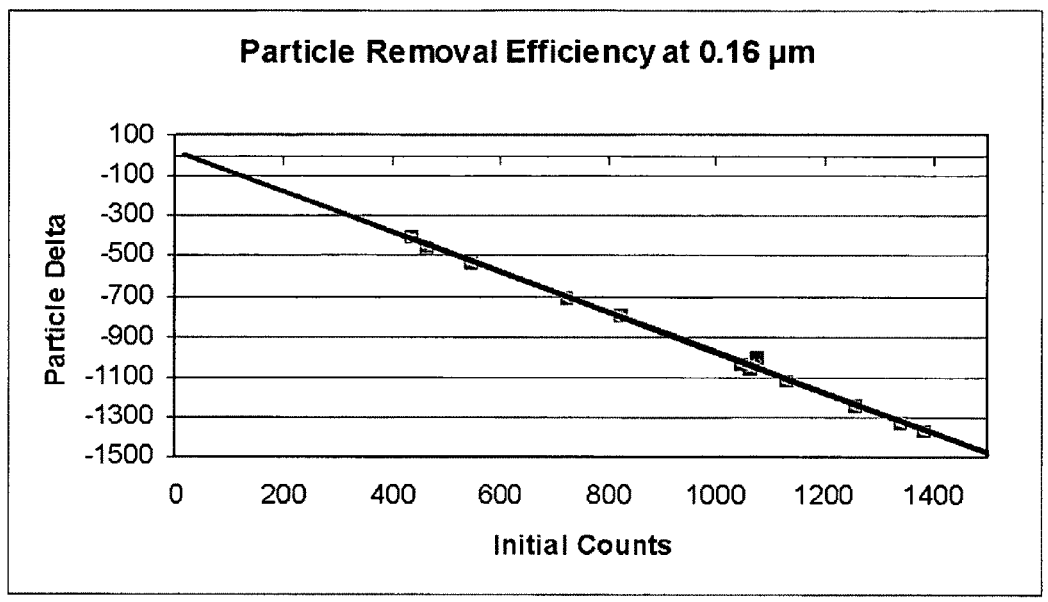
Figure 3: Graph Illustrating Particle Removal Efficiency for Less Contaminated Wafers (<15000 Particles at 0.16 μm) Subjected to Prior Art AFEOL Cleaning Sequence

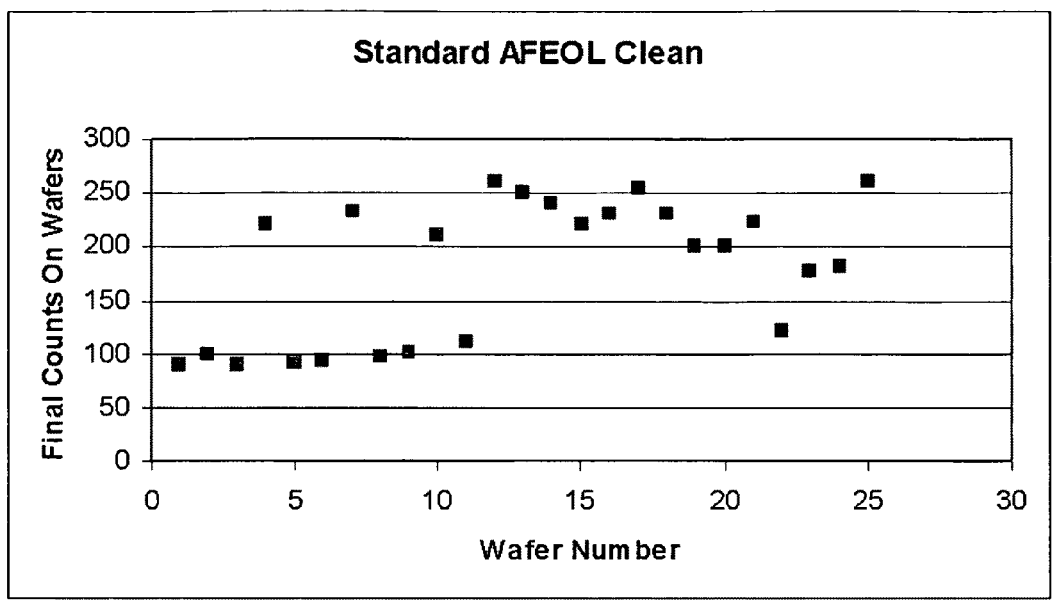
Fig. 4: Graph Illustrating Final particles Counts Obtained After Prior Art AFEOL Clean Sequence (0.16 μm)

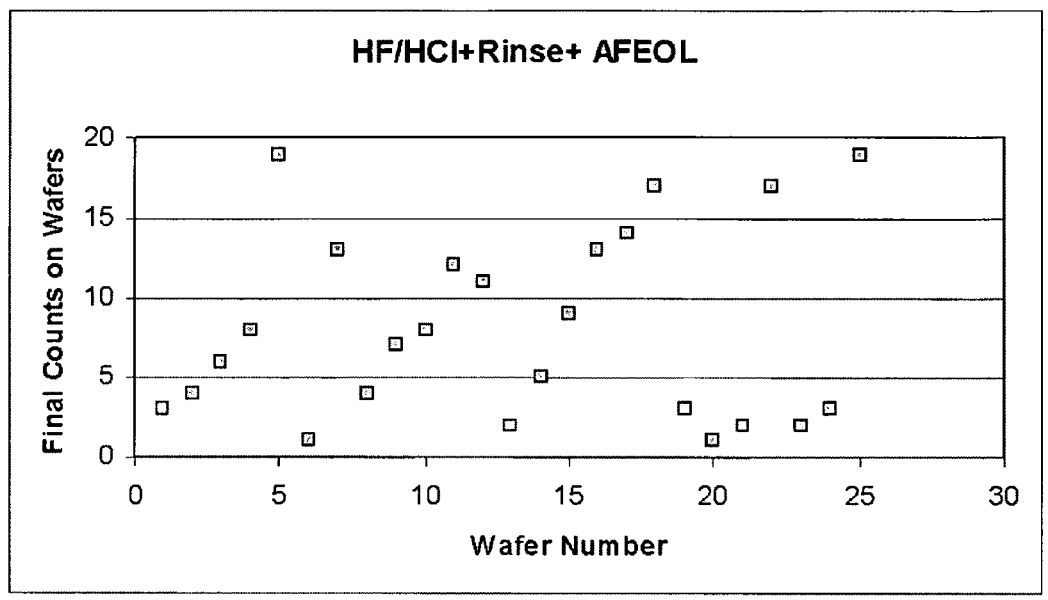
Figure 5: Graph Illustrating Final Particles Counts Obtained Using An Embodiment of The Inventive AFEOL Cleaning Sequence of Table 2 (0.16 μm)

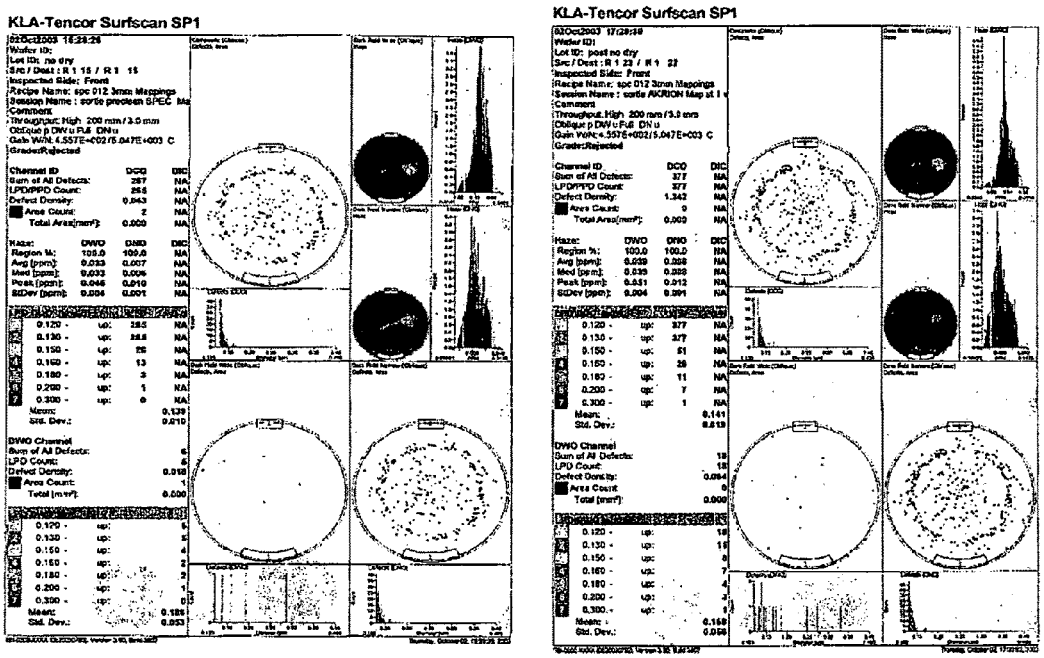
Figure 6: Wafers Exhibiting Patterns of Irremovable Defects (0.12 μm) When Passivation Step Not Utilized Prior to SC1 Application (KLA_Tencor SP1[TBI] Laser Scanner)

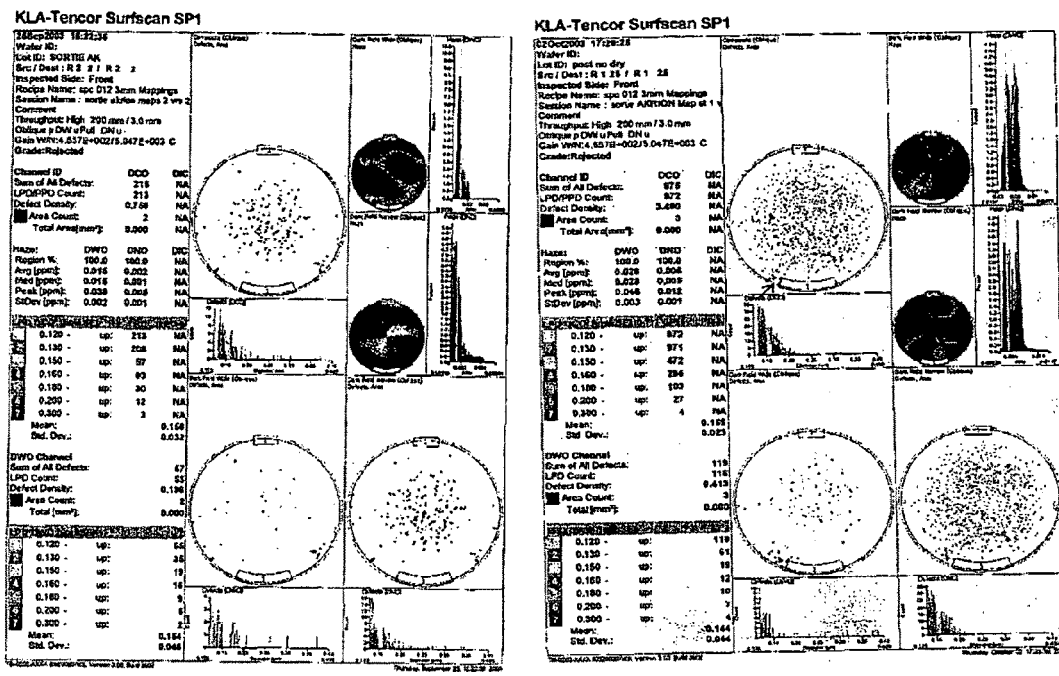
Fig. 7: Wafers Exhibiting Irremovable Defects Increasing In Size or Added Pitting (0.12μm) When Passivation Step Not Utilized Prior to SC1 Application (KLA_Tencor SP1[TBI] Laser Scanner)

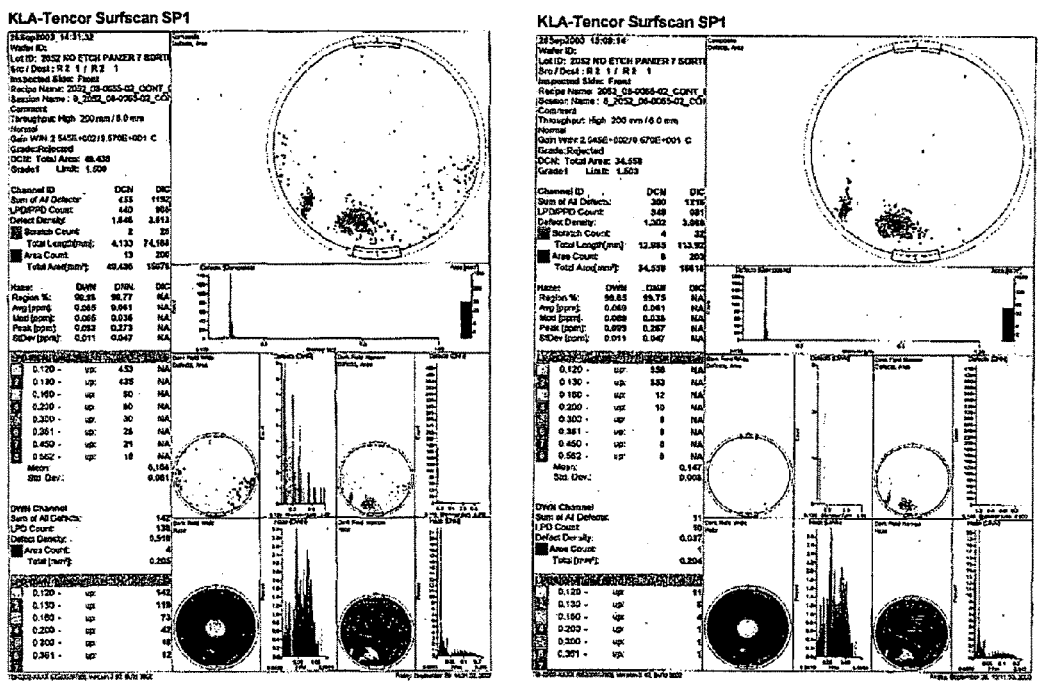
Figure 8: Illustration of H-terminated Wafers Suffering From Metal-Induced Pitting In The SC1 solution (0.12μm) When Passivation Step Not Utilized Prior to SC1 Application
(KLA_Tencor SP1[TBI] Laser Scanner)

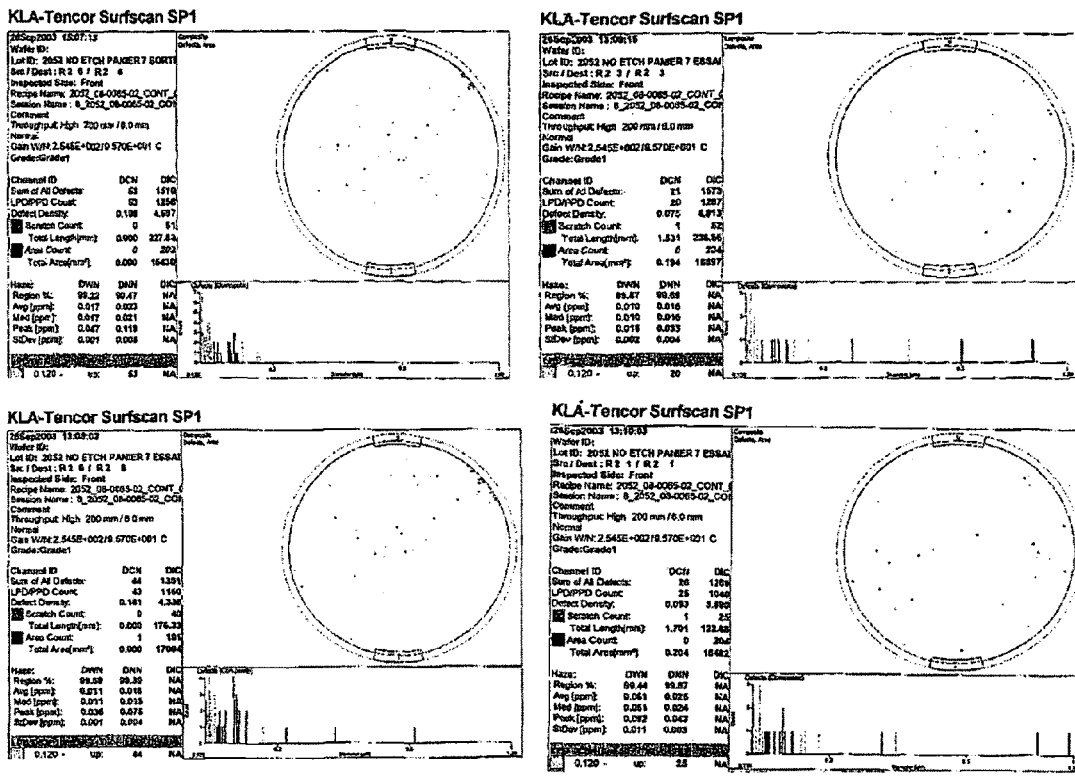
Figure 9: Illustration of Final Counts On Wafers Cleaned Using Inventive AFEOL Cleaning Sequence (0.12 µm) Using Passivation (KLA_Tencor SP1[TBI] Laser Scanner)

US 8,741,066 B2

METHOD FOR CLEANING SUBSTRATES UTILIZING SURFACE PASSIVATION AND/OR OXIDE LAYER GROWTH TO PROTECT FROM PITTING

CROSS-REFERENCE TO RELATED PATENT APPLICATIONS

The present application claims the benefit of U.S. Provisional Patent Application 60/890,375, filed Feb. 16, 2007, the entirety of which is hereby incorporated by reference.

FIELD OF INVENTION

The present invention relates generally to the field of processing substrates, and specifically to methods of removing particles and contaminants from semiconductor substrates while limiting substrate surface roughness.

BACKGROUND OF THE INVENTION

The manufacturing of advanced integrated circuits (IC) typically uses about 350 steps. One fourth of these steps are dedicated to semiconductor wafer surface cleaning to remove any contaminants from the previous steps and/or prepare the surface for the subsequent steps. In this regard, the importance of clean semiconductor wafer surfaces in the fabrication of semiconductor devices or advanced integrated circuits has been recognized since the beginning of the industry. Failing to removes trace impurities, such as sodium ions, metals, and particles, from a semiconductor wafer surface is known to be especially detrimental during high-temperature processing because the impurities tend to spread out and diffuse into the semiconductor wafer, thereby altering the electrical characteristics of the semiconductor devices formed in the wafer. Altering a semiconductor device's electrical characteristics cause the device to fail and, therefore, subtracts from a wafer's yield. The inadequate and/or improper drying of a semiconductor wafer surface is also known to negatively affect a wafer's yield.

During advanced integrated circuit manufacturing, it is difficult or sometimes impossible to measure every production wafer. Instead, monitor wafers are processed at the same time along with the product wafers. These monitor wafers (sometimes called witness, filler, or dummy) provide information on how the batch was processed. If the monitor wafers show good results, then the production wafers are assumed to be good as well. To maximize cost savings these monitor wafers are reclaimed. At the end of the IC manufacturing cycle, these wafers are reconditioned and used again for a new cycle. Wafer surface preparation is therefore important with respect to these reclaimed wafers and has become one of the most critical steps in the manufacturing of semiconductors.

With requirements to make sub-100 nm semiconductor devices, as well as economic and environmental pressures, it is desirable that new cleaning techniques be developed. For example, existing techniques for freeing small particles from the surface of a semiconductor wafer utilize a combination of chemical and mechanical processes. One typical cleaning chemistry used in the art is standard clean 1 ("SC1"), which is a mixture of ammonium hydroxide, hydrogen peroxide, and water. SC1 oxidizes and etches the surface of the wafer.

Numerous techniques have also been established with respect to post chemical mechanical processing ("CMP") cleaning procedures, which focus mainly in reducing the defects (particles) on the wafer surface. For example, wet cleaning methods include immersion cleaning, spray cleaning, and contact cleaning. Most of the process of record (POR) methods typically use brush scrubbers and are based on an RCA type process. These procedures have proven to be costly and do not necessarily produce the desired wafer surface characteristics. These desirable characteristics include low particles counts, undetectable metals, limited surface roughness, and undetectable organics. Accordingly, in light of these aforementioned drawbacks, there is a need for improved cleaning techniques. Such cleaning techniques should be cost sensitive and provide the lowest cost of ownership. This could include a smaller tool footprint, low chemical consumptions, and reduced or limited environmental, safety and health concerns.

SUMMARY OF THE INVENTION

It is therefore an object of the present invention to provide an advanced front end of line (AFEOL) cleaning approach.

It is also an that is an object of the present invention to provide an improved AFEOL cleaning approach that meets the more stringent semiconductors manufacturing requirements, including low particle counts and limited surface roughness.

These problems and others are solved by the present invention which in one aspect is a method of cleaning a substrate comprising a) supplying an etching solution to etch a surface of the substrate; b) rinsing the substrate with an ozonated solution to passivate the surface of the substrate; and c) supplying SC1 to the substrate, whereby step b) substantially prevents pitting on the surface of the substrate during step c).

The etching solution can be a HF solution. In one embodiment, the HF solution has a concentration of about 0.1% to about 0.5% by weight of HF in water. The etching solution can also be a diluted HF:HCL solution. In another embodiment, the concentration of HF to HCL to water is about 1:2:200. The etching solution can be applied to the substrate for about 3-7 minutes. The etching solution can also be applied to the substrate at a temperature of about 22-27 degrees Celsius.

In another aspect, the present invention is the method of cleaning a substrate comprising: a) supporting the substrate in a substantially horizontal position; b) rotating the substrate about a rotational center point; c) supplying HF solution to etch a surface of the substrate; d) rinsing the substrate with an ozonated solution to passivate the surface of the substrate; and e) supplying SC1 to the substrate, whereby step d) substantially prevents pitting on the surface of the substrate during step e). In one embodiment, steps a) through e) are conducted in a single chamber and the substrate is not removed from the chamber between steps The substrate can also be rotated at a substantially constant rotational speed during completion of steps c) through e).

In another aspect, the present invention is a method of cleaning a substrate comprising: a) supplying an etching solution to etch a surface of the substrate; b) rinsing the substrate with DI water; c) supplying ozone gas to passivate the surface of the substrate; and d) supplying SC1 to the substrate, whereby step c) substantially prevents pitting on the surface of the substrate during step d). In one embodiment, the etching solution is an HF solution, preferably having a concentration of about 0.1% to about 0.5% by weight of HF in water. In another embodiment, the etching solution is an diluted HF:HCL solution. Preferably, the concentration of the diluted HF:HCL solution is about 1:2:200. The etching solution can be applied to the substrate for about 4-6 minutes and at a temperature of about 22-26 degrees Celsius. In another embodiment, the substrate is rinsed with the DI water for about 4-6 minutes and at a temperature of about 20 degrees Celsius. In a further embodiment, gaseous ozone is supplied to the substrate for about 4-6 minutes.

In yet another aspect, the present invention is a method of cleaning a substrate comprising: a) supporting the substrate in a substantially horizontal position; b) rotating the substrate about a rotational center point; c) supplying HF solution to etch a surface of the substrate; d) rinsing the substrate with DI water; e) supplying ozone gas to passivate the surface of the substrate; and supplying SC1 to the substrate, whereby step e) substantially prevents pitting on or roughening of the surface of the substrate during step f). In one embodiment, the HF solution has a concentration of about 0.1% to about 0.5% by weight of HF in water. In another embodiment, the HF solution is supplied to the substrate for about 4-6 minutes and at a temperature of about 22-26 degrees Celsius. In a further embodiment, the substrate is rinsed with DI water for about 4-6 minutes and at a temperature of about 20 degrees Celsius. In another embodiment, steps a) through e) are conducted in a single chamber and the substrate is not removed from the chamber between steps. The substrate can also be rotated at a substantially constant rotational speed during completion of steps c) through e).

In a further aspect, the present invention is a method of cleaning a semiconductor substrate comprising: a) supplying an etching solution to etch a surface of the substrate; b) rinsing the substrate with an ozonated solution to passivate the surface of the substrate; c) supplying a SC1 solution to the substrate; d) rinsing the substrate with DI water; e) supplying the etching solution to the substrate; f) rinsing the substrate with the ozonated solution; and g) drying the substrate with IPA vapor.

The etching solution can be an HF solution, preferably having a concentration of about 0.1% to about 0.5% by weight of HF in water, or a diluted HF:HCL solution having a aqueous concentration of 1:2:200. In one embodiment, the SC1 solution is applied to the substrate while applying acoustic energy to the substrate. The SC1 solution can be applied to the substrate for about 10-15 minutes. In another embodiment, the substrate is rinsed with the DI water at a temperature of between about 0.1 degrees Celsius to about 20 degrees Celsius, preferably while applying acoustic energy to the substrate.

In another aspect, the present invention is a method of cleaning a semiconductor substrate comprising: a) supporting the substrate in a substantially horizontal position; b) rotating the substrate about a rotational center point; c) supplying a diluted HF:HCL solution to the substrate; d) rinsing the substrate with an ozonated solution to passivate the surface of the substrate; e) supplying a SC1 solution to the substrate while applying acoustic energy to the substrate; f) rinsing the substrate with a heated rinse solution while applying acoustic energy to the substrate; g) supplying the diluted HF:HCL solution to the substrate; h) rinsing the substrate with the ozonated solution; and i) drying the substrate with IPA vapor.

In one embodiment, steps a) through i) can be conducted in a single chamber and the substrate is not removed from the chamber between steps. Steps a) through i) can be conducted in a single chamber and the substrate is not removed from the chamber between steps. Alternatively, any of the methods discussed above can be carried out in batch processing immersion tanks.

In still another aspect, the invention can be a method of processing a substrate comprising: a) providing at least one substrate; b) etching a surface of the substrate by applying an etching solution; c) passivating the etched surface of the substrate by applying ozone; and d) cleaning the passivated surface of the substrate by applying an aqueous solution comprising ammonium hydroxide and hydrogen peroxide.

In a further aspect, the invention can be a post-CMP semiconductor wafer cleaning method comprising: a) performing a chemical mechanical polish to at least one surface of at least one semiconductor wafer; b) etching the surface of the wafer by applying an etching solution; c) rinsing the etched surface of the wafer; d) passivating the rinsed surface of the wafer by applying ozonated deionized water; e) cleaning the passivated surface of the wafer by applying a standard-clean 1 solution; f) rinsing the cleaned surface of the wafer; g) etching the rinsed surface of the wafer by applying an etching solution; h) passivating the rinsed surface of the wafer by applying ozonated deionized water; and i) drying the rinsed surface of the wafer.

In another aspect, the invention can be a method of processing a substrate comprising: a) providing at least one substrate; b) cleaning a surface of the substrate by applying an aqueous solution comprising ammonium hydroxide and hydrogen peroxide; and c) applying ozone gas to the surface of the substrate.

BRIEF DESCRIPTION OF DRAWINGS

FIG. 2 is a graph illustrating particle removal efficiency for highly contaminated wafers (at less than 16,000 particles at 0.16 µm) when subjected to the prior art AFEOL post-CMP cleaning sequence.

FIG. 3 is a graph illustrating particle removal efficiency for less contaminated wafers (at less than 1,500 particles at 0.16 µm) when subjected to the prior art AFEOL post-CMP cleaning sequence.

FIG. 4 is a graph illustrating final particle counts (0.16 µm) for wafer subjected to the prior art AFEOL post-CMP cleaning sequence.

FIG. 5 is a graph illustrating final particle counts obtained after a post-CMP AFEOL clean according to one embodiment of the present invention (0.16 µm).

FIG. 6 is a surface scan schematic of wafers illustrating irremovable defects (0.12 µm).

FIG. 7 is a surface scan schematic of wafers illustrating irremovable defects causing an increase in defect size or an increase in the number of pits (0.12 µm).

FIG. 8 is a diagram illustrating H-terminated wafers with metal-induced pitting caused via application of the SC1 solution (0.12 µm).

FIG. 9 is a surface scan schematic illustrating final particle counts on wafers processed through the AFEOL cleaning method according to one embodiment of the present invention (0.12 µm).

DETAILED DESCRIPTION

Figure 1:
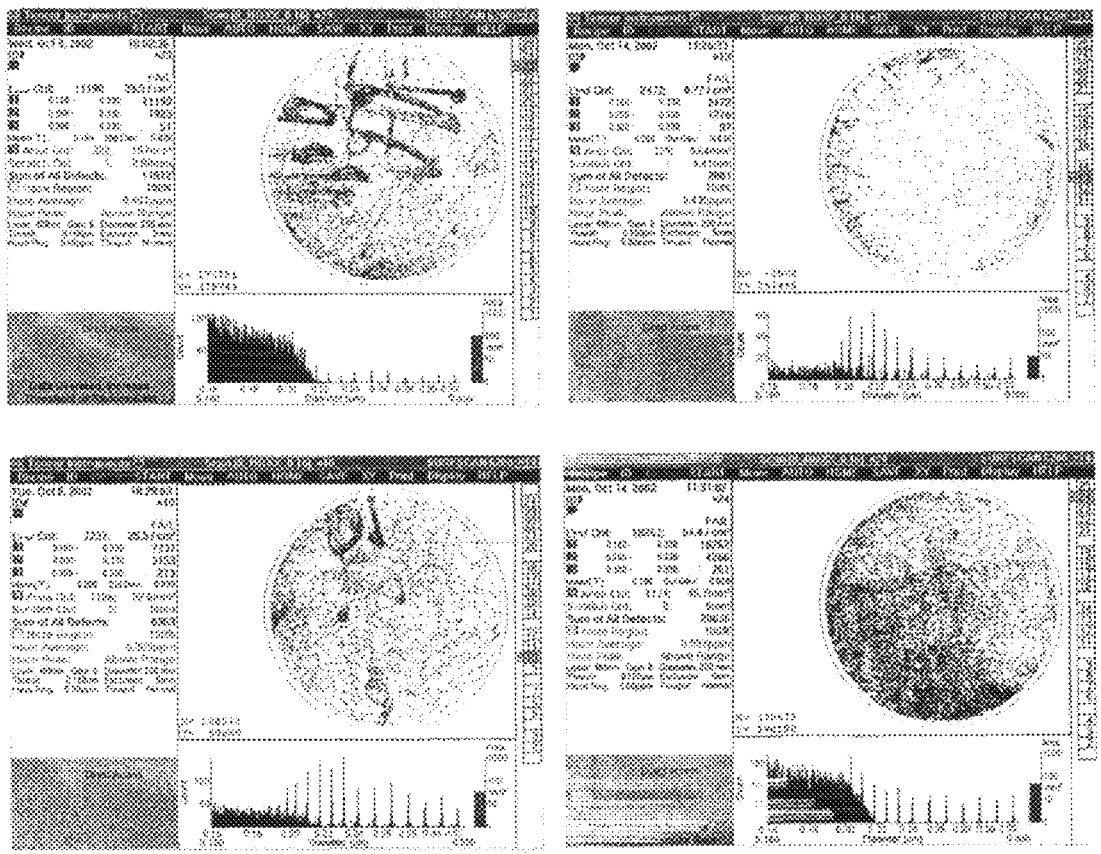
FIG. 1 is a diagram illustrating contamination levels on wafers when subjected to a prior art AFEOL post-CMP cleaning sequence.

The preferred embodiments will be illustrated with reference to the drawings. Various other embodiments should become readily apparent from this description to those skilled in the art.

The present invention generally relates to cleaning processes, specifically to post CMP-cleaning processes. As devices continue to shrink below 100 nm, wafer surface preparation has become more critical to high yield devices. Numerous techniques have established a post CMP cleaning procedure that focused mainly on reducing the defects (particles) on the wafer surface. Most of the process of record (POR) methods typically use brush scrubbers and are based on an RCA type process, which have proven to be costly among other drawbacks. In addition it has been found through experimentation that such procedures do not produce the most desired wafer surface characteristics, including lowest particles counts, removal of undetectable metals, limited surface roughness, and removal of undetectable organics. The present invention is a new advanced front end of line (AFEOL) clean, which is an alternative to high cost scrubbing wafer-cleaning systems. The AFEOL of the present invention is a process that is capable of meeting the stricter manufacturing low particle requirements.

Through experimentation, wafers that were highly contaminated from CMP processing, were processed in an AFEOL fully automated GAMA system, which is a modular wet station adaptable to a variety of cleaning applications for batch immersion applications. In initial attempts to clean highly contaminated CMP-processed wafers, a prior art AFEOL process recipe was tested. This prior art AFEOL process recipe is set forth in Table 1 directly below:

TABLE 1

Prior Art AFEOL Clean Sequence

| Step/Concentration | Time, min. | Temp., C. | Purpose |
|---|---|---|---|
| DIO3 | 5 | 24 | Remove Organics |
| SC1 (1:2:30) w Megasonic | 6.5 | 60 | Remove Particles |
| QDR Rinse | 7.5 | Amb. ~20 | Rinse off chemicals |
| HF/HCl (1:2:200) | 5 | 24 | Remove Metals |
| Ozone HFC Rinse | 8 | Amb. ~20 | Regrow Oxide |
| LuCID Dryer | 10 | Amb. | Dry wafers |

The prior art AFEOL process recipe of Table 1 was used as a reference point to give an indication of the type of improved cleaning characteristic required and/or achieved by the present invention. Due to the amount of contamination on the wafers (2000-16000 LPD's @ 0.16 μm), it was hypothesized that more aggressive cleaning was required than the standard AFEOL recipe disclosed in Table 1. In a first attempt to improve cleaning, various parameters of the prior art AFEOL process recipe (e.g., time, temperature, concentration, etc.) were adjusted to ascertain if sufficient cleaning could be achieved. However, the results were unsatisfactory (as described in greater detail below and shown in Table 3).

Referring to FIG. 1, resulting contamination levels on the test wafers after being subjected to the adjusted prior art AFEOL cleaning recipes are shown. The graphs set forth in FIGS. 2 and 3 illustrate that the prior art AFEOL cleaning recipes achieved high particle removal efficiency (as measured by the slope of the regression line) for both low and high contamination levels. However, referring to FIG. 4, the final counts obtained from the prior art AFEOL cleans were still higher than the desired values. Furthermore, it was discovered that increasing the SC1 time and temperatures yielded better results but was not found to be economically feasible approaches. Thus, it was concluded that additional process optimization and/or a new recipe was needed.

For highly contaminated wafers, a breakthrough in the optimization of particle removal efficiency was achieved when the initial $DIO_3$ application step was replaced with an etching step. More specifically, the initial $DIO_3$ application step was replaced with an HF etching step. This step was designed to remove the native oxide (i.e., contamination). It was hypothesized that this would enable more efficient particle removal by the cleaning chemistry. As can be seen from FIG. 5, the modification to replace the $DIO_3$ step with and HF step produced significantly better results. Additional adjustments of the remaining parameters were then developed and carried out to further maximize surface cleaning (e.g., improved wafer surface characteristics, including low particles counts, the removal of undetectable metals, limited surface roughness, and the removal of undetectable organics). In addition, experiments applying acoustic energy (e.g., megasonic energy) were conducted and incorporated in various steps throughout the inventive AFEOL cleaning recipe (e.g., megasonic energy was incorporated into the post SC1 rinse tank).

The final recipe according to one embodiment of the present invention is set forth in Table 2 directly below:

TABLE 2

Inventive AFEOL Cleaning Sequence Having Pre-Clean HF/HCl Etch Step to Remove Contaminated Oxide and Ozonated Rinse

| | Step/Concentration | Time, min. | Temp., (° C.) | Purpose |
|---|---|---|---|---|
| STEP 1 | HF/HCl (1:2:200) | 5 | 24 | Remove metals and contaminated oxide |
| STEP 2 | HFC Rinse - w/or w/o Ozone | 8 | Amb. ~20 | Rinse off chemicals (and passivate wafer surface) |
| STEP 3 | SC1 (1:2:30) w/Megasonic | 10 | 70 | Remove particles |
| STEP 4 | QDR Rinse w/Megasonic | 10 | Hot | Rinse off chemicals |
| STEP 5 | HF/HCl (1:2:200) | 5 | 24 | Remove chemical oxide and |
| STEP 6 | Ozone Rinse | 8 | Amb. ~20 | Rinse off chemicals (and passivate wafer surface) |
| STEP 7 | LuCID Dryer | 10 | | Dry wafers |

As can be seen in Table 2 above, at STEP 1 of the inventive AFEOL process an etching solution is supplied to the substrate to etch its surface to remove metals and contaminated oxide. The etching solution is preferably an aqueous HF solution (e.g. 0.1 to 0.5% by weight HF) or a diluted aqueous HF:HCL solution (e.g., 1 HF:2 HCL:200 $H_2O$). In one embodiment, the etching solution is preferably applied at a temperature of 20 to 30° C. for about 2 to 8 minutes, and most preferably at a temperature of 24° C. for about 5 minutes. Of course, the etching step is not limited to any specific concentration, temperature and/or time in all embodiments of the invention.

As STEP 2, the etched substrate is then rinsed utilizing a high flow cascade rinse ("HFC"). This rinse can be performed using deionized ("DI") water and/or ozonated DI water ("$DIO_3$"). In one embodiment, the rinsing is preferably performed at an ambient temperature for about 6 to 10 minutes, and most preferably at a temperature of about 20° C. for about 8 minutes. Of course, the rinsing step is not limited to any specific concentration, temperature and/or time in all embodiments of the invention. The DI water serves to rinse off the chemicals from the substrate surface. In embodiments where $DIO_3$ is used, it has been found that the ozone passivates the surface of the substrate. The impact of passivation will be discussed in greater detail below. It should be noted that in embodiments where passivation is desirable, the substrates can be subjected to ozone in any form, including ozone gas or a another ozonated solution.

At STEP 3, hot SC1 cleaning solution (1 $NH_4OH$:2 $H_2O_2$: 30 $H_2O$) is then supplied to the rinsed and/or passivated substrate while acoustical energy is contemporaneously applied to the substrate. The acoustical energy is preferably megasonic energy. In one embodiment, the SC1 is preferably applied at a temperature of 50-90° C. for about 8 to 12 minutes, and most preferably at a temperature of about 70° C. for about 10 minutes. Of course, the SC1 step is not limited to any specific concentration, temperature and/or time in all embodiments of the invention. The SC1 solution, in combination with the megasonic energy, removes particles and/or other contaminants from the substrate. In some embodiments, acoustical energy may not be applied during the SC1 application.

At STEP 4, the cleaned substrate is then subjected to a quick dump rinse ("QDR") with hot DI water while acoustical energy is applied. The acoustical energy is preferably megasonic energy. In one embodiment, QDR is preferably performed for about 8 to 12 minutes, and most preferably for about 10 minutes. Of course, as with the other rinse steps, this rinse step is not limited to any specific rinsing technique, temperature and/or time in all embodiments of the invention. The QDR, in combination with the megasonic energy, removes chemicals (and possibly loosened particles and/or other contaminants) from the substrate. In some embodiments, acoustical energy may not be applied during this step.

At STEP 5, the substrate is then subjected to another etching step. The etching solution is preferably an aqueous HF solution (e.g. 0.1 to 0.5% by weight HF) or a diluted aqueous HF:HCL solution (e.g., 1 HF:2 HCL:200 $H_2O$). In one embodiment, the etching solution is preferably applied at a temperature of 20 to 30° C. for about 2 to 8 minutes, and most preferably at a temperature of 24° C. for about 5 minutes. Of course, the etching step is not limited to any specific concentration, temperature and/or time in all embodiments of the invention.

At STEP 6, the substrate is exposed to an ozonated rinse with $DIO_3$. In one embodiment, the rinsing is preferably performed at an ambient temperature for about 6 to 10 minutes, and most preferably at a temperature of about 20° C. for about 8 minutes. Of course, the rinsing step is not limited to any specific concentration, temperature and/or time in all embodiments of the invention. As discussed above, the DI water serves to rinse off the chemicals from the substrate surface while the ozone has been found to passivate the surface of the substrate. It should be noted that in embodiments where passivation is desirable, the substrates can be subjected to ozone in any form, including ozone gas or a another ozonated solution. This can be performed in conjunction with or instead of a rinse.

Finally, at STEP 7, the substrate is dried. The drying process can be any suitable drying known in the art. However, in one embodiment, the drying process can a process that utilizes IPA and DI water to effectuate the Marangoni principle (i.e., surface tension gradient).

Referring now to FIG. 5, when the inventive AFEOL recipe of Table 2 was utilized for a batch of wafers, the final counts on the wafers were less than 20 particles at 0.16 μm for all wafers tested.

In addition to the embodiment of the AFEOL recipe discussed above, a second inventive embodiment of an AFEOL recipe was also developed that is particularly suitable for wafers having lower levels of contamination. This second inventive AFEOL recipe is set forth in Table 2A directly below:

TABLE 2A

Inventive AFEOL Clean Sequence Having Ozone Gas Application for Oxide Re-Growth and/or Passivation

| | Step/Concentration | Time, min. | Temp., C. | Purpose |
|---|---|---|---|---|
| STEP 1 | SC1 (1:2:30) + Meg | 6.5 | 60 | Remove Particles |
| STEP 2 | QDR Rinse | 7.5 | Amb. ~20 | Rinse off chemicals |
| STEP 3 | HF/HCl (1:2:200) | 5 | 24 | Remove Metals |
| STEP 4 | DIW rinse | 5 | Amb ~20 | Rinse off HF acid |
| STEP 5 | O3 gas | 5 | | Regrow oxide |
| STEP 6 | Ozone HFC Rinse + meg | 8 | Amb. ~20 | Remove particles |
| STEP 7 | Dryer | 10 | Amb. | Dry wafers |

In order to avoid redundancy, some of the details of the inventive AFEOL recipe of Table 2A will be omitted with the understanding the principles discussed above are applicable. It is to be understood that the various steps of the recipes discussed in Tables 2, 2A can be swapped and/or inter-mixed as desired. Additionally, acoustic energy can be applied to any step desired.

At STEP 1, hot SC1 cleaning solution (1 $NH_4OH$:2 $H_2O_2$: 30 $H_2O$) is supplied to the substrate while acoustical energy is contemporaneously applied. The acoustical energy is preferably megasonic energy. In one embodiment, the SC1 is preferably applied at a temperature of 40-80° C. for about 4.5 to 8.4 minutes, and most preferably at a temperature of about 60° C. for about 6.5 minutes. Of course, the SC1 step is not limited to any specific concentration, temperature and/or time in all embodiments of the invention. The SC1 solution, in combination with the megasonic energy, removes particles and/or other contaminants from the substrate. In some embodiments, acoustical energy may not be applied during the SC1 application.

At STEP 2, the cleaned substrate is then subjected to a QDR with ambient DI water. In one embodiment, QDR is preferably performed for about 5.5 to 9.5 minutes, and most preferably for about 7.5 minutes. Of course, as with the other rinse steps, this rinse step is not limited to any specific rinsing technique, temperature and/or time in all embodiments of the invention.

At STEP 3, an etching solution is supplied to the substrate to etch its surface to remove metals. The etching solution is preferably an aqueous HF solution (e.g. 0.1 to 0.5% by weight HF) or a diluted aqueous HF:HCL solution (e.g., 1 HF:2 HCL:200 $H_2O$). In one embodiment, the etching solution is preferably applied at a temperature of 20 to 30° C. for about 3 to 7 minutes, and most preferably at a temperature of 24° C. for about 5 minutes. Of course, the etching step is not limited to any specific concentration, temperature and/or time in all embodiments of the invention.

At STEP 4, the substrate is then rinsed utilizing DI water. A high flow cascade, QDR or other technique can be sued. In one embodiment, the rinsing is preferably performed at an ambient temperature for about 3 to 7 minutes, and most preferably at a temperature of about 20° C. for about 5 minutes. Of course, the rinsing step is not limited to any specific concentration, temperature and/or time in all embodiments of the invention. The DI water serves to rinse off the chemicals from the substrate surface.

At STEP 5, the substrate is exposed to an ozone gas to passivate the surface and/or regrow an oxide layer. In one embodiment, the ozone is applied preferably for about 3 to 7 minutes, and most preferably for about 5 minutes. The exposure to ozone passivates the surface of the substrate, thereby decreasing pitting and roughness on the surface of the substrate that would occur at the next step. It should be noted that in other embodiments, the substrates can be subjected to ozone in any form, including an ozonated solution. However, using gaseous ozone to convert the surface to a hydrophilic state has the following advantages. First, ozone in gasous form can react with the substrate surface faster than when in an ozonated solution. In other words, the diffusion is faster in gas than it is in liquid. There is also minimal or no contamination from rinse water reacting with the hydrophobic water since the wafers are exposed to a high concentration of gaseous ozone.

At STEP 6, the substrate is then subjected to an ambient HFC rinse with $DIO_3$ while acoustical energy is contemporaneously applied. The acoustical energy is preferably megasonic energy. In one embodiment, the rinsing is preferably performed at an ambient temperature for about 6 to 10 minutes, and most preferably at a temperature of about 20° C. for about 8 minutes.

Finally, at STEP 7, the substrate is dried. The drying process can be any suitable drying known in the art. However, in one embodiment, the drying process can a process that utilizes IPA and DI water to effectuate the Marangoni principle (i.e., surface tension gradient).

Referring now to Table 3 below, a summary of the results associated with both the prior art AFEOL recipe, the modified AFEOL recipes and the inventive AFEOL recipes are set forth. As will be noted, particle counts on the wafers were lower than those obtained for the POR. In addition, the standard deviation for these results was much smaller than that of the POR, resulting in the AFEOL clean being more effective. No metals were detected above 5E9 atoms/cm$^2$ on the wafer surface when the inventive AFEOL recipes were used.

TABLE 3

Summary of Final Particle Counts after Various Cleaning Methods.

| Run | Process | Pre @ 0.16 um | Post @0.16 um |
|---|---|---|---|
| A | POR | 2000-10000 | 40-100 |
| B | AFEOL | 2000-10000 | 90-260 |
| C | AFEOL × 2 | 2000-10000 | 30-120 |
| D | AFEOL (SC1 10 mins @ 70 deg C.) | 2000-10000 | 10-350 |
| E | AFEOL + 2nd SC1 | 2000-10000 | 10-240 |
| F | DIO3/SC1/Rinse/Dry - No HF | 2000-10000 | 30-470 |
| G | HF/HCl-O3Rinse-SC1-Rinse-HF/HCl-O3Rinse-Dry | 2000-10000 | 20-100 |
| H | HF/HCl-Rinse (No O3)-SC1-Rinse w Meg-HF/HCl-O3Rinse-Dry | 2000-10000 | 4-50 |
| I | HF-(Rinse + O3)-SC1 15 mins-Cold Rinse w Meg-HF/HCl-O3Rinse-Dry | 2000-10000 | <20 |
| J | SC1 15 mins + Cold Rinse w/Meg + HF + O3Rinse + Dry | 200-1000 @ 0.1 um | <50 @ 0.1 um |

The processes disclosed above were designed for test grade polished wafers. When these recipes are implemented to process wafers in manufacturing, it is apparent that the wafer quality can negatively affect the results. This can be easily seen when the wafers are examined at a higher resolutions, e.g., 0.12 μm or lower as measured on KLA_Tencor SP1$^{TBI}$ laser scanner.

As shown in FIG. 6, the wafer exhibits a circular pattern of particles clustered in the center. When these wafers were processed in the designed SC1, an increase in the number of light point defects (LPDs) was repeatedly experienced. For example, the LPDs counts increased from 267 to 377 as shown in FIG. 7 or from 215 to 975 as shown in FIG. 8. These defects are theorized to be crystal-originated pits or particles (COPs) and cannot be removed by the cleaning process. The number of defects was found to increase with the SC1 concentration, time and temperature. The $H_2O_2$ concentration has become very critical to minimize these defects. The higher the $H_2O_2$ concentration the lower the number of pits induced.

Furthermore, it was discovered that when the substrates were processed with the HF solution then followed by the SC1 solution, metal-induced pitting or roughening was found on the surface of the substrates. Such metal-induced pitting or roughening caused defects, which as illustrated in FIG. 6 appear to be substantially permanent in nature. This pattern of defects as illustrated in FIGS. 6 and 7 was shown to be substantially permanent such that the defects are very difficult to remove by cleaning process including scrubbing. It has been hypothesized that the step of applying HF solution to a wafer leaves the wafer hydrophobic. Hydrophobic wafers are very sensitive the SC1 and ionic impurity contents. Thus, the application of SC1 to a wafer immediately after the application of a HF solution causes damage (e.g., pitting and roughness) to the surface, as illustrated in FIG. 8. This defect was also found to increase with the SC1 concentration, time, temperature and metal impurity levels.

However, in order to minimize pitting and roughness, the inventive AFEOL process was further optimized to include the passivation step, which in one embodiment utilizes the application of ozone in form or another after etching. The passivation occurs as the surface of the substrate as a result of a reaction with/to the ozone, resulting in the substrate surface adding/growing a thin film of native oxide. An oxide film thickness of about 10 Å was found to be sufficient to protect the Si from the metal-induced pitting from application of the SC1 solution. Once the silicon wafers were passivated, no microroughness was found on any of the wafers tested, as shown in FIG. 9. An average of particle final counts on the wafers of less than 20 at 0.12 μm was reported following the inventive recipes and using pit-free wafers.

The results show that the AFEOL clean outperformed the POR. The addition of the dHF or dHF/dHCl was necessary to remove contaminants and thus enabling cleaning. The results also show that the use of megasonic energy and hot rinse added additional robustness and statistically tight counts on the wafers surface. The use of ozonated rinse after HF was found to be important to prevent the metal-induced pitting on hydrophobic wafers from the SC1. The final particle counts and elemental metal signature were far lower than those obtained in the POR cleans.

While the invention has been described and illustrated in sufficient detail that those skilled in this art can readily make and use it, various alternatives, modifications, and improvements should become readily apparent without departing from the spirit and scope of the invention. Particularly, it should be understood that certain steps of the inventive AFEOL process recipes can be omitted in certain in instances and/or alternatively arranged.

What is claimed is:

1. A method of processing a substrate comprising:
   a) providing at least one substrate;
   b) performing a chemical mechanical polish to the substrate;
   c) etching a surface of the substrate by applying an aqueous etching solution comprising hydroflouric acid and hydrochloric acid;
   d) passivating the etched surface of the substrate by applying ozone subsequent to step c) and prior to step e); and
   e) cleaning the passivated surface of the substrate by applying an aqueous solution comprising ammonium hydroxide and hydrogen peroxide.

2. The method of claim 1 further comprising:
   f) etching the cleaned surface of the substrate;
   g) passivating the etched surface of the substrate b applying ozone; and
   h) drying the passivated surface of the substrate.

3. The method of claim 2 further comprising:
   rinsing the etched surface of the substrate subsequent to step c) but prior to step e);
   rinsing the cleaned surface of the substrate subsequent to step e) but prior to step f) while applying megasonic energy; and
   rinsing the etched surface of the substrate subsequent to step e) but prior to step h).

4. The method of claim 1 wherein the aqueous solution applied in step e) is standard-clean 1 (SC1) having a ratio of ammonium hydroxide to hydrogen peroxide to water of about 1:2:30.

5. The method of claim 1 wherein step e) comprises applying megasonic energy during the application of the aqueous solution.

6. The method of claim 1 wherein step d) is accomplished by applying ozone gas to the surface of the substrate or applying an ozonated liquid to the surface of the substrate.

7. The method of claim 1 wherein the aqueous solution comprising hydroflouric acid and hydrochloric acid has a ratio of hydroflouric acid to hydrochloric acid to water of about 1:2:200.

8. The method of claim 1 wherein step c) is performed for 4-6 minutes, step d) is performed for 7-9 minutes, and step e) is performed for 9-11 minutes.

9. The method of claim 1 wherein step d) is accomplished by applying an ozonated deionized water to the surface of the substrate at an ambient temperature, and wherein the etching solution of step c) is applied at a temperature of 22-26 degrees Celsius, and wherein the aqueous solution of step e) is applied at a temperature of 60-70 degrees Celsius.

10. The method of claim 1 wherein steps c) through e) are carried out as a batch immersion process or as a single-substrate non-immersion process.

11. A post-CMP semiconductor wafer cleaning method comprising:
   a) performing a chemical mechanical polish to at least one surface of at least one semiconductor wafer;
   b) etching the surface of the wafer by applying an etching solution comprising hydroflouric acid and hydrochloric acid;
   c) rinsing the etched surface of the wafer;
   d) passivating the rinsed surface of the wafer by applying ozonated deionized water, wherein step d) is performed subsequent to step c) and prior to step e);
   e) cleaning the passivated surface of the wafer by applying: a standard-clean 1 solution while applying megasonic energy;
   f) rinsing the cleaned surface of the wafer while applying megasonic energy;
   g) etching the rinsed surface of the wafer by applying an etching solution;
   h) passivating the rinsed surface of the wafer by applying ozonated deionized water; and
   i) drying the rinsed surface of the wafer;
   wherein step b) is performed subsequent to step a).

* * * * *